(12) United States Patent
Kroulik

(10) Patent No.: US 11,310,948 B2
(45) Date of Patent: Apr. 19, 2022

(54) BENDABLE SHIELDED BUS BAR

(71) Applicant: FLEX-CABLE, Howard City, MI (US)

(72) Inventor: Erwin Kroulik, Edmore, MI (US)

(73) Assignee: Flex-Cable, Howard City, MI (US)

( * ) Notice: Subject to any disclaimer, the term of this patent is extended or adjusted under 35 U.S.C. 154(b) by 382 days.

(21) Appl. No.: 16/083,933

(22) PCT Filed: Mar. 13, 2017

(86) PCT No.: PCT/US2017/022089
§ 371 (c)(1),
(2) Date: Sep. 11, 2018

(87) PCT Pub. No.: WO2017/156529
PCT Pub. Date: Sep. 14, 2017

(65) Prior Publication Data
US 2020/0296867 A1 Sep. 17, 2020

Related U.S. Application Data

(60) Provisional application No. 62/307,089, filed on Mar. 11, 2016.

(51) Int. Cl.
*B32B 15/02* (2006.01)
*B32B 15/20* (2006.01)
*H05K 9/00* (2006.01)

(52) U.S. Cl.
CPC ........... *H05K 9/0086* (2013.01); *B32B 15/02* (2013.01); *B32B 15/20* (2013.01); *H05K 9/0098* (2013.01)

(58) Field of Classification Search
CPC .... B32B 1/08; B32B 3/06; B32B 3/26; B32B 3/266; B32B 7/04; B32B 7/02;
(Continued)

(56) References Cited

U.S. PATENT DOCUMENTS 3,202,756 A * 8/1965 Stanback ................. H02G 5/06
174/99 B
3,240,867 A 3/1966 Maddox
(Continued)

FOREIGN PATENT DOCUMENTS

| CN | 201886831 U | * | 6/2011 | ............. H01B 11/18 |
| CN | 101743667 B | * | 3/2013 | ......... H01R 13/6593 |
| WO | 03105301 A1 | | 12/2003 | |

OTHER PUBLICATIONS

Compt Low Voltage Panel Boards_ENG_QDR_2013_pp. 1-58_ May 2013.*
(Continued)

*Primary Examiner* — Timothy J Thompson
*Assistant Examiner* — Guillermo J Egoavil
(74) *Attorney, Agent, or Firm* — Blue Filament Law PLLC

(57) ABSTRACT

A bus bar assembly is provided that includes an electrical conductor with a rectangular cross-section. A first insulation layer surrounds the electrical conductor. A shielding layer surrounds the first insulation layer. The shielding layer is formed from an embossed conductive foil wrapped around the first insulation layer with overlapping sections. A method of making the bus bar assembly is provided that includes an electrical conductor being surrounded with a first insulating layer. The first insulating layer is then wrapped with a shielding layer formed from a conductive foil wrapped around the first insulation layer.

17 Claims, 3 Drawing Sheets

(58) Field of Classification Search
CPC ....... B32B 15/02; B32B 15/043; B32B 15/06;
B32B 15/095; B32B 15/18; B32B 15/20;
B32B 25/14; B32B 25/16; B32B 25/20;
B32B 27/06; B32B 27/285; B32B
2250/04; B32B 2250/42; B32B 2255/06;
B32B 2255/26; B32B 2307/202; B32B
2307/206; B32B 2307/544; B32B
2307/546; B32B 2307/732; B32B
2457/00; B32B 15/08; B32B 27/40; B32B
2307/212; B60R 16/03; H01B 7/06;
H01B 7/17; H01R 25/14; H02B 1/20;
H02G 3/0468; H02G 5/04; H02G 5/061;
H02G 5/005; H05K 9/0086; H05K
9/0098; H05K 9/00; Y10T 29/49117
USPC ............................................ 174/68.2; 29/825
See application file for complete search history.

(56) References Cited

U.S. PATENT DOCUMENTS

| | | | |
|---|---|---|---|
| 3,821,463 A | 6/1974 | Bakker | |
| 4,436,953 A * | 3/1984 | Gottlieb | H02G 5/005 174/72 B |
| 4,851,608 A | 7/1989 | Seip | |
| 4,896,001 A | 1/1990 | Pitts et al. | |
| 4,965,408 A | 10/1990 | Chapman et al. | |
| 6,674,652 B2 | 1/2004 | Forte et al. | |
| 2002/0062974 A1* | 5/2002 | Curro | B32B 5/245 174/68.1 |
| 2003/0155143 A1* | 8/2003 | Fujieda | B82Y 30/00 174/354 |
| 2003/0186602 A1 | 10/2003 | Millas et al. | |
| 2006/0131061 A1* | 6/2006 | Seigerschmidt | H01B 7/0892 174/117 FF |
| 2007/0037419 A1* | 2/2007 | Sparrowhawk | H01B 11/1008 439/98 |
| 2010/0214713 A1* | 8/2010 | Song | B32B 3/26 361/220 |
| 2010/0319958 A1 | 12/2010 | Latimer | |
| 2011/0017487 A1 | 1/2011 | Short | |
| 2012/0043107 A1* | 2/2012 | Nair | H01B 7/0876 174/103 |
| 2012/0103651 A1* | 5/2012 | Kim | H01B 11/1808 174/102 R |
| 2013/0037299 A1* | 2/2013 | Harwath | H01P 3/06 174/115 |
| 2013/0068495 A1 | 3/2013 | Hadi et al. | |
| 2013/0319518 A1* | 12/2013 | Doech | H01L 31/02008 136/256 |
| 2015/0111059 A1 | 4/2015 | Tanaka et al. | |
| 2015/0188302 A1 | 7/2015 | Kim et al. | |
| 2016/0242290 A1* | 8/2016 | Maebashi | H05K 3/3447 |
| 2017/0231124 A1* | 8/2017 | Kobayashi | H05K 9/0098 |
| 2017/0236622 A1* | 8/2017 | Yoshino | H01B 11/1895 174/107 |

OTHER PUBLICATIONS

Copper Busbar Rating_Austral_pp. 1-5_2015.*
Electrical Calculations_Photonics Ltd_pp. 4-61_Jan. 2006.*
International Search Report dated Jun. 30, 2017 for International Application No. PCT/US2017/022089 filed Mar. 13, 2017.

* cited by examiner

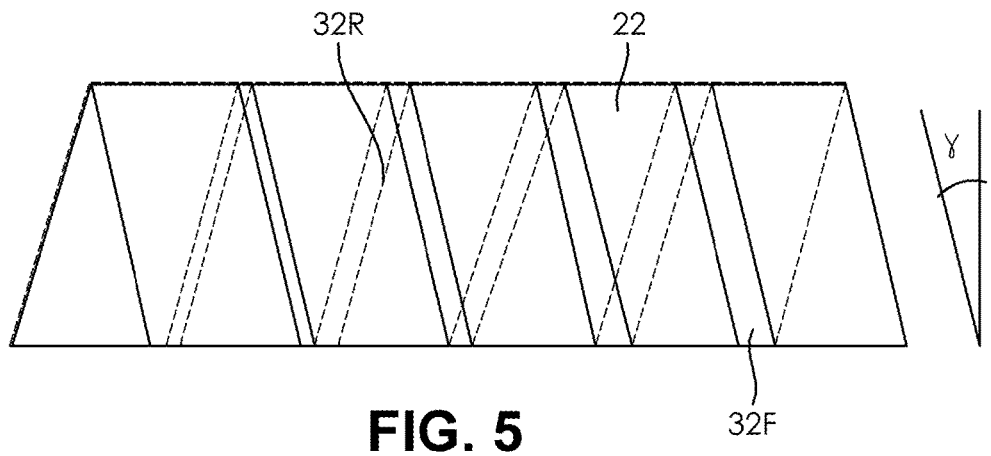
FIG. 5
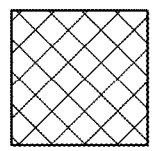 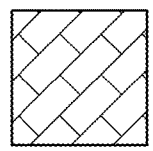 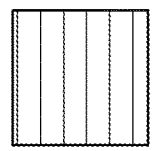 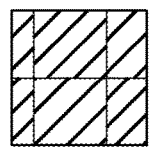 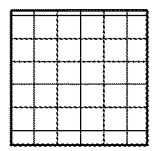
FIG. 6A  FIG. 6B  FIG. 6C  FIG. 6D  FIG. 6E
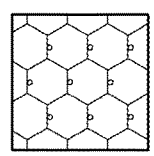 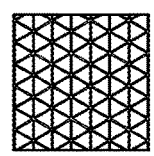 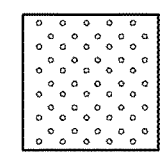
FIG. 6F  FIG. 6G  FIG. 6H

BENDABLE SHIELDED BUS BAR

RELATED APPLICATIONS

This application claims priority benefit of U.S. Provisional Application Ser. No. 62/307,089 filed 11 Mar. 2016; the contents of which are hereby incorporated by reference.

FIELD OF THE INVENTION

The present invention in general relates to electrical power distribution and in particular to a bendable bus bar with a shielding layer that can be bent and twisted without affecting the level of shielding performance.

BACKGROUND OF THE INVENTION

A bus bar distributes electrical power using a metallic strip or bar to conduct electricity. Bus bars are designed to reduce power loss contributed by surface effects by using a larger surface area as compared to wires. The material composition and cross-sectional size of the bus bar determines the maximum amount of current that can be safely carried. Bus bars are typically formed from conductors including copper, brass, or aluminum, and are designed to conduct high current loads. Bus bars are produced in a variety of shapes such as flat strips, solid bars and rods, solid or hollow tubes, and braided wire. Some of these shapes allow heat to dissipate more efficiently due to their high surface area to cross-sectional area ratio. The skin effect makes 50-60 Hertz (Hz) alternating current (AC) bus bars more than about 8 millimeters (0.31 in) thickness inefficient, so hollow or flat shapes are prevalent in higher current applications. A bus bar may either be supported on insulators, or else insulation may completely surround the bus bar. Bus bars may be connected to each other and to electrical apparatus by bolted, clamped, or welded connections. Often, joints between high-current bus sections have precisely-machined matching surfaces that are silver-plated to reduce the contact resistance.

Electromagnetic shielding acts to reduce the electromagnetic field in a space by blocking the field with barriers made of conductive or magnetic materials. Shielding is typically applied to enclosures to isolate electrical devices from the 'outside world', and to cables to isolate wires from the environment through which the cable runs. Electromagnetic shielding that blocks radio frequency electromagnetic radiation is also known as RF shielding. The shielding can reduce the coupling of radio waves, electromagnetic fields and electrostatic fields. Typical materials used for electromagnetic shielding in enclosures include sheet metal, metal screen, and metal foam. RF shielding used for electrical wiring, cables, and bus bars is typically formed as braid of conductive materials. A prior art example of a bus bar 10 with a metal conductive braid 12 is shown in FIG. 1. Any holes in the shield or mesh must be significantly smaller than the wavelength of the radiation that is being kept out, or the enclosure will not effectively approximate an unbroken conducting surface. Copper is an excellent material for RF shielding because copper absorbs radio and magnetic waves, has a high electrical conductivity, is ductile, malleable, and solders easily.

Bus bars are often used in assemblies and applications where the bus bar is required to make extreme twists and bends to make required electrical connections. An example of an extreme twist and bend is shown in FIG. 1. As is evident in the circled area A, the bending of the bus bar 10 causes the braiding 12 to separate. The separation of the braiding 12 may adversely affect the shielding effectiveness of the braid 12, and allow RF signals to couple on to the bus bar, or for signals to leak from the bus bar to other sensitive electrical or electronic components used in the application device or system.

Thus, there exists a need for a bendable bus bar that may be twisted and bent without causing degradation in the shielding performance of the shielding layer.

SUMMARY OF THE INVENTION

A bus bar assembly is provided that includes an electrical conductor with a rectangular cross-section. A first insulation layer surrounds the electrical conductor. A shielding layer surrounds the first insulation layer. The shielding layer is formed from an embossed conductive foil wrapped around the first insulation layer with overlapping sections.

A method of making a bus bar assembly is provided that includes an electrical conductor being surrounded with a first insulating layer. The first insulating layer is then wrapped with a shielding layer formed from a conductive foil wrapped around the first insulation layer.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 illustrates an overlapping pattern of the conductive wrap in accordance an embodiment of the inventive bendable bus bar; and FIGS. 6A-6H illustrate examples of embossed patterns in the conductive wrap in accordance with embodiments of the invention.

DETAILED DESCRIPTION OF THE INVENTION

The present invention has utility as a bendable bus bar that may be bent and twisted without causing separation gaps in the shielding layer. The ability to bend and twist the shielding layer without causing gaps prevents degradation in the shielding performance of the shielding layer of embodiments of the bendable bus bar. The shielding layer is formed with a conductive foil wrap, that has embossed patterns to prevent unwanted creasing and bunching when twisting and bending occurs.

As used herein "embossed" is defined to include a material that has features that have been pressed into relief out of the plane of the material and also includes features that have been cut from the material to form fenestrations.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

The conductive foil wrap may be stored as a ribbon on a roll. The conductive foil may be formed from aluminum, copper, tin, nickel, stainless steels, and alloys containing any of the aforementioned or laminates thereof. An alloy that contains any of the aforementioned will have an individual metal present in an amount of at least present of 20 total weight percent or if more than one of the aforementioned metals in present, in a collective amount of at least 30 total weight percent. The thickness of the foil is typically between 0.0178 and 0.2134 mm in thickness, where thickness is measured in a non-embossed region of the material ribbon. The shielding layer is formed by wrapping the foil ribbon around an insulting layer of a bus bar with overlapping portions or seams 32F (front) and 32R (rear), where the degree or width of overlap is determined by the wrapping angle $Y$ as shown in FIG. 5. The wrapping angle $Y$ may be in a range of twenty to seventy degrees (20°-70°). The insulating layer is a conventional polymer that illustratively includes ethylene propylene polymers, such as ethylene propylene rubber (EPR) and ethylene propylene diene monomer (EPDM); silicone rubbers such as polydimethylsiloxane, thiophene rubbers, thermoplastic polyether polyurethane, and copolymers containing any of the aforementioned as blocks of a co-polymer or randomized copolymers. It is appreciated that insulating layers are routinely applied on a bus bar through techniques including extrusion and dip coating.

Figure 2:
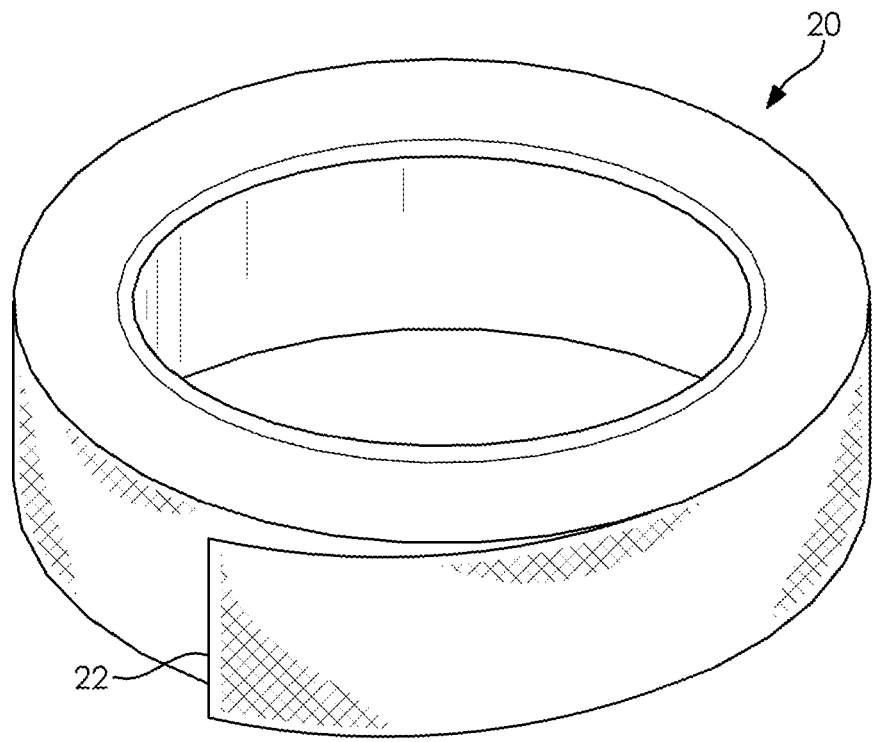
FIG. 2 illustrates a perspective view of a roll of shielding wrap used to form a shielding layer in accordance with embodiments of the invention.

Referring now to the figures, FIG. 2 shows a ribbon roll 20 of shielding wrap 22 that may be used to form a shielding layer for inventive embodiments of the bendable bus bar. The shielding wrap 22 has an embossed diamond pattern however it is appreciated that other embossed patterns may be used. Illustrative non-limiting examples are shown in FIGS. 6A-6H where the regions defined between black lines are raised in a one direction relative to the plane of the page that represents the ribbon plane, opposing directions, or when an area is bounded by lines, each bound area independently is a cut-out, synonymously referred to herein as a fenestration. FIG. 6A shows the diamond pattern, while FIG. 6B is a pattern of offset rectangles arranged at an angle. FIG. 6C depicts longitudinal or vertical lines depending on the embossing angle chosen, and FIG. 6D are diagonal lines. FIG. 6E is a screen like pattern of squares. FIG. 6F is a hexagonal pattern with a central dimple. FIG. 6G is a close-packed trigonal pattern. FIG. 6H is a close packaged dimple array pattern. It is appreciated that fenestrations are used to form a screen with openings, where the openings are effectively sized to block frequencies required in the environment of the application the bus bar is used in. The use of fenestrations saves on material and on weight at the expense of potential for leakage. Leakage in turn is in turn offset by overlapping successive wrappings and determining the frequencies of electromagnetic radiation that will be created when the bus bar is in operation. The shielding wrap 22 in specific instances lacks an adhesive backing as found in a tape, since an adhesive backing restricts the free movement of the shielding wrap 22 with flexure and twisting of the bus bar.

Figure 1:
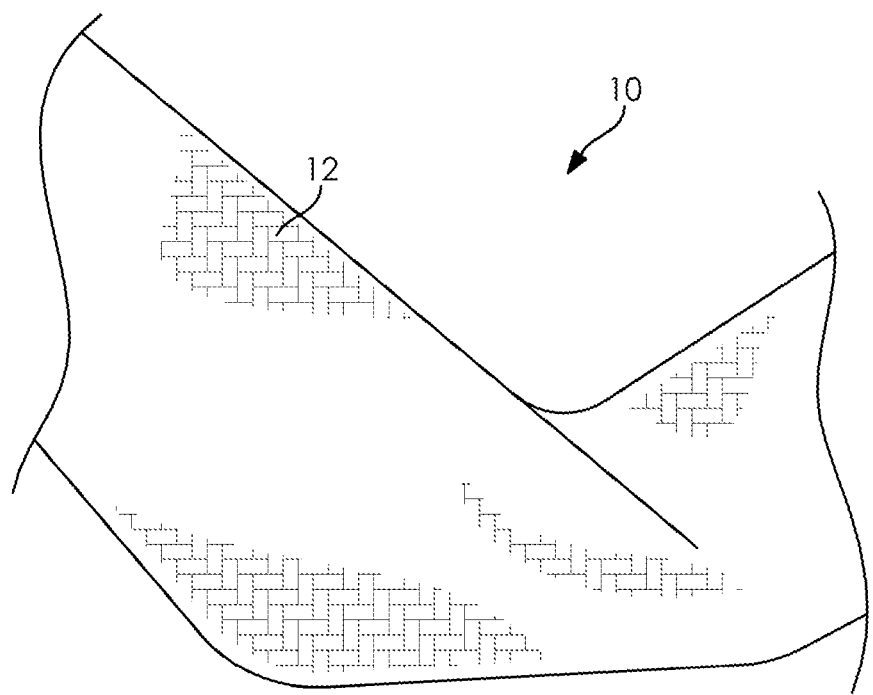
FIG. 1 illustrates a perspective view of a prior art bus bar with a braided shielding layer.
Figure 3:
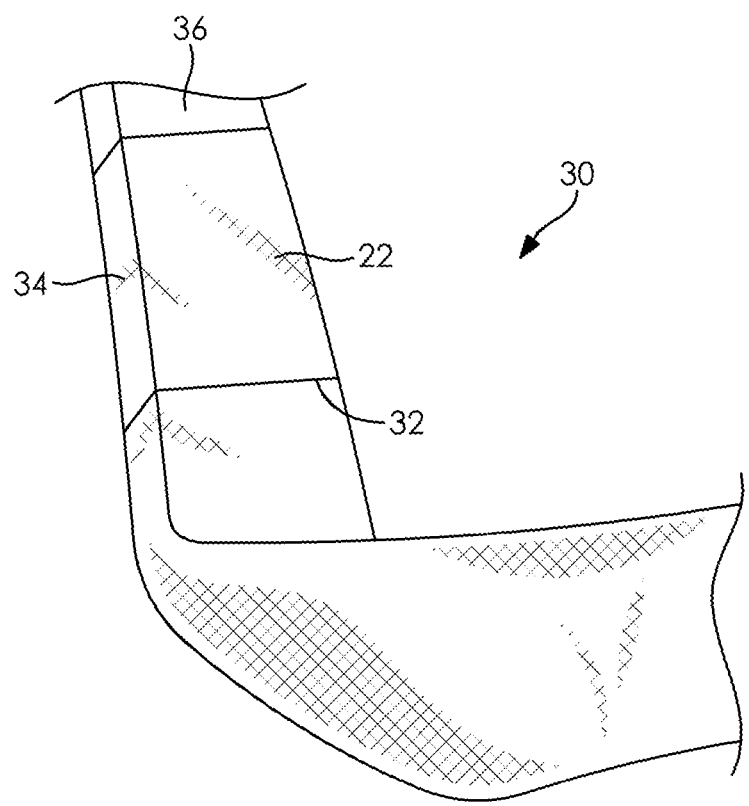
FIG. 3 illustrates a perspective view of an embodiment of the inventive bendable bus bar without an outer insulating jacket to illustrate the integrity of the shield wrap with a right angle bend and twist.

FIG. 3 illustrates a perspective view of an embodiment of the inventive bendable bus bar 30 without an outer insulating jacket to illustrate the integrity of the shield wrap 22 with a right angle bend and twist. As can be seen in the figure the shield wrap 22 has overlapping seams 32 that form a shielding layer 34 over an insulating layer 36 that covers the bus bar conductor. The insulating layer may be formed from a pliable and bendable material such as plastics, composites, or rubber. As may be seen in the area of the bend and twist in the circled area B, the wrap does not separate or deform as is the case with braided shielding layers as was shown in area A of FIG. 1.

Figure 4:
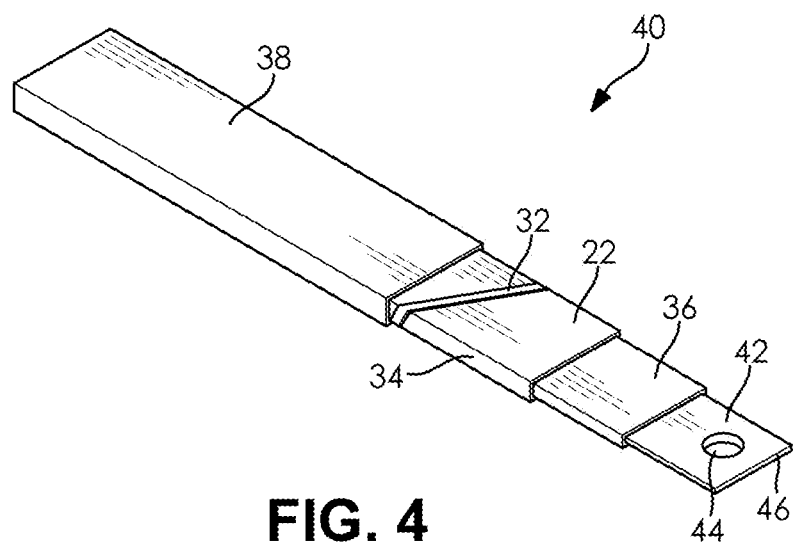
FIG. 4 illustrates a sectioned perspective view showing a conductive bus bar with an interior insulating layer, wrapped in a shielding layer formed with a conductive wrap and an outer insulator in accordance with an embodiment of the invention.

FIG. 4 illustrates a sectioned perspective view showing an embodiment of a conductive bus bar assembly 40 with an interior insulating layer 36 covering a conductor 42 that is wrapped in a shielding layer 34 formed with a conductive wrap 22 and an outer insulator 38. In particular, inventive embodiments, it appears that an embossed pattern raised on only one side of the ribbon when wrapped with the raised features interior provides greater flexure prior to tearing that when the raised features are exterior. The shielding layer 34 in some embodiments is wrapped with overlap areas 32. In other inventive embodiments the shielding layer 34 is wrapped with end-to-end seams. Overlap areas between successive wraps range from 0 to 50% of the ribbon width. The conductor 42 may illustratively include copper, brass, aluminum, stainless steel alloys, or other high conductivity materials designed to carry high current loads. While the cross-section of the conductor is shown as rectangular, it is appreciated that other cross-sectional shapes may be used illustratively including rods, solid or hollow tubes, and braided wire. In some inventive embodiments, braided wire layer is intermediate between the conductor and the shielding layer/In still other embodiments, the wire braid is adjacent to the shielding layer and is either inter to, or external to the shielding layer. An aperture 44 at the terminating ends 46 may be used to secure the bus bar assembly 40 to an electrical assembly.

The foregoing description is illustrative of particular embodiments of the invention, but is not meant to be a limitation upon the practice thereof. The following claims, including all equivalents thereof, are intended to define the scope of the invention.

The invention claimed is:

1. A bus bar assembly comprising:
   an electrical conductor having the shape of a bar, rod, flat strips, or tube, the electrical conductor having a rectangular cross-section;
   a first insulation layer surrounding the electrical conductor, the first insulation layer having an outer surface with four sides;
   a shielding layer surrounding the outer surface of said first insulation layer and contacting the four sides, said shielding layer formed from only an embossed conductive foil spirally wrapped around the first insulation layer with overlapping sections and a plurality of overlapping seams.

2. The bus bar assembly of claim 1 further comprising a second insulating layer above the shielding layer.

3. The bus bar assembly of claim 1 wherein said conductive foil is formed in a ribbon.

4. The bus bar assembly of claim 1 wherein a degree or width of the overlapping sections is determined by a wrapping angle $Y$.

5. The bus bar assembly of claim 4 wherein the wrapping angle $Y$ is between twenty to seventy degrees.

6. The bus bar assembly of claim 1 wherein said conductive foil is embossed with a pattern in only one direction from a plane of said conductive foil.

7. The bus bar assembly of claim 6 wherein said pattern is at least one of diamonds, offset rectangles, or squares.

8. The bus bar assembly of claim 6 wherein said pattern is at least one of longitudinal, vertical, or diagonal lines depending on the embossing angle chosen.

9. The bus bar assembly of claim 1 wherein said conductive foil is fenestrated.

10. The bus bar assembly of claim 1 wherein said conductive foil is a screen like pattern of squares, hexagons, triangles, or dimples.

11. The bus bar assembly of claim 2 wherein said first insulator layer and said second insulator layer is formed rubber, plastic, or other composite materials.

12. The bus bar assembly of claim 1 wherein said electrical conductor is made of copper, brass, aluminum, stainless steel alloys, or other high conductivity materials.

13. The bus bar assembly of claim 1 further comprising a set of terminations on said electrical conductor.

14. A method of making a bus bar assembly, the method comprising:

providing an electrical conductor having the shape of a bar, rod, flat strips, or tube, the electrical conductor having a rectangular cross-section;

surrounding said electrical conductor with a first insulating layer, the first insulation layer having an outer surface with four sides;

spirally wrapping the outer surface of said first insulating layer with a shielding layer such that the shielding layer has overlapping sections and a plurality of overlapping seams that contact the four sides of said first insulating layer; and wherein said shielding layer is formed from only an embossed conductive foil wrapped around the first insulation layer.

15. The method of claim 14 further comprising placing a second insulating layer above the shielding layer.

16. The method of claim 14 wherein said embossed conductive foil is formed in a ribbon.

17. The method of claim 16 wherein said wrapping is with overlapping sections with successive wraps wherein the overlapping sections overlap between 0 and 50% of a width of said ribbon.

* * * * *